United States Patent [19]

Knoop et al.

[11] Patent Number: 5,118,307
[45] Date of Patent: Jun. 2, 1992

[54] CONTACT STRIP

[75] Inventors: Franz Knoop, Bueren-Steinhausen; Franz Werner, Paderborn, both of Fed. Rep. of Germany

[73] Assignee: Siemens Nixdorf Informationssysteme AG, Paderborn, Fed. Rep. of Germany

[21] Appl. No.: 669,919

[22] Filed: Mar. 15, 1991

[30] Foreign Application Priority Data

Mar. 19, 1990 [DE] Fed. Rep. of Germany ... 9003209[U]

[51] Int. Cl.⁵ .......................................... H01R 13/648
[52] U.S. Cl. ........................................ 439/607; 439/575; 439/55
[58] Field of Search ............ 439/92, 95, 96, 101, 439/108, 535, 536, 538, 539, 540, 552, 553, 557, 562, 567, 575, 607, 55; 174/48, 51, 52.1, 53, 54, 58, 35

[56] References Cited

U.S. PATENT DOCUMENTS

| 2,934,590 | 4/1960 | Thompson et al. | 439/535 |
| 3,185,760 | 5/1965 | Despard | 174/54 |
| 3,780,209 | 12/1973 | Schuplin | 174/51 |
| 4,295,003 | 10/1981 | Borja et al. | 174/53 |
| 4,699,438 | 10/1987 | Kikuta | 439/95 |

FOREIGN PATENT DOCUMENTS

| G 8712020.8 | 1/1988 | Fed. Rep. of Germany . |
| G 8803544.1 | 8/1988 | Fed. Rep. of Germany . |
| 3717009A1 | 12/1988 | Fed. Rep. of Germany . |
| 200252 | 4/1983 | German Democratic Rep. . |
| 448045 | 6/1936 | United Kingdom . |

*Primary Examiner*—David L. Pirlot
*Attorney, Agent, or Firm*—Varnum, Riddering, Schmidt & Howlett

[57] ABSTRACT

The invention relates to contact strip (16) for slipping over the edge (22) of a wall unit (14), whereby a longitudinal edge (20) of the contact strip is designed cliplike and the contact strip has contact areas (24) bent out of the plane of the strip. The contact areas are formed by a single row, spaced apart from each other, contact tongues (24), stamped and bent out of the plane of the contact strip and by the cliplike longitudinal edge formed with a row of individual clip elements (20) distributed over length of the strip and spaced apart from each other.

8 Claims, 2 Drawing Sheets

CONTACT STRIP

BACKGROUND OF THE INVENTION

1. Field of the Invention

The invention relates to contact strips and more particularly to contact strips for attachment to the edges of wall units.

2. Prior Art

It is a common technique to equip the edge of printed circuit boards with a wall unit transversely to the plane of the circuit board, whereby the wall units make up a more or less closed wall, which contains several inserted printed circuit boards next to each other. The wall units are either closed surfaces of are equipped with plug elements which can be connected electrically to outside devices via the respective printed circuit boards. To ensure that the wall, consisting of all units, is sealed against electromagnetic stray radiation, the single wall units have to be connected to each other electrically conducting.

It is already known to arrange spring-loaded contact plates projecting from the longitudinal edges of the wall units, which are touching the contact plates of the adjoining wall units. With this design, a contact plate is fastened to each edge which faces the adjoining wall unit, which makes this solution laborious and expensive.

It is already known to fasten a contact strip with protruding contact points to the right-angled edge of a wall unit, these points having contact with the contact points of the adjoining wall element. The contact strip has embossed contact bulges over its whole length without gaps. For this reason, the contact strip becomes very stiff, so that it cannot conform to the assigned wall unit, which has become deformed due to manufacturing inaccuracies. The fitting of the contact strip, under these conditions, could be very difficult. Furthermore, the number of contact points to the adjoining wall unit is very high, that for an example, the sliding in of the contact strip between two adjoining wall elements is sometimes possible only with difficulty. Another disadvantage is seen in the fact that the contact strip is bent like a clip over the entire length also, this characteristic makes the contact strip very stiff which increases the described difficulties even more. Also, the clip arrangement requires large forces to install due to the large area of clip contact, when the wall element gets slightly thicker, for an example, when rust starts to form.

It is an object of this invention to create a contact element which is very simple in terms of production and installation and is inexpensive and which does not require a great deal of force for installation if confronted with production inaccuracies or the start of rust or such inaccuracies of the wall units.

SUMMARY OF THE INVENTION

In the first place, the invention takes advantage of the knowledge that stray radiation-safe shielding does not require a contact without gaps, e.g., a very dense contact area configuration. On the contrary, larger gaps are harmless, the size of these depends on the type of electric stray radiation.

According to the invention, the development and arrangement of the contact tongues, in contrast to known embossed types, results in a very flexible contact strip, which conforms easily to deformations of the wall element, without marked deterioration of the stray radiation shielding. According to the invention, the development and arrangement of the clip elements do not lead to too much rigidity in this area. In addition, the frictional forces created on one hand by the contact tongues and on the other hand by the clip elements are less dependent on manufacturing inaccuracies, e.g., the condition of the surface of the wall elements.

The contact tongues can be fabricated in a simple way with a single stamping-bending operation.

The clip elements preferably are made in one piece with the contact strip. They also can be fabricated in a single stamping-bending operation and with a suitable tool even in one operation with the manufacturing of the contact tongues.

The required spacing of the contact tongues can be determined by known methods as to the characteristics of the stray radiation to shield from.

To assure good tractive power on the edge, the invention provides additionally that the clip elements are equipped with recesses for locking onto the lugs on the edge. The recesses lock in automatically when the contact strip is pushed onto the edge, and on one hand form an exact alignment of the contact strip and edge, and on the other hand assure a secure fit of the contact strip.

In the longitudinal section, the contact tongues have preferably approximately the shape of an obtuse-angled hook with a first leg bent away from the contact strip plane and a following leg bent back in the direction of the contact strip plane. The bent edge between the first leg and the second leg forms a line-shaped contact zone on the contact area of the adjoining wall unit.

In addition, the invention provides that the edge of the contact strip opposite of the clip elements is beveled to the side of the clip elements. This design assures that this longitudinal edge does not interfere with the assigned adjoining wall unit when inserting a printed circuit board and with that positioning a wall unit between existing wall units.

According to another embodiment of the invention, the contact tongues are designed with recesses which decrease the cross section of the material in the bending area. By suitable choice of measurements of this recess, the remaining material cross section and with that the spring force of the contact tongues can be determined.

BRIEF DESCRIPTION OF THE DRAWING

An illustrative embodiment of the invention is described below with reference to the drawing in which.

DETAILED DESCRIPTION

Figure 1:
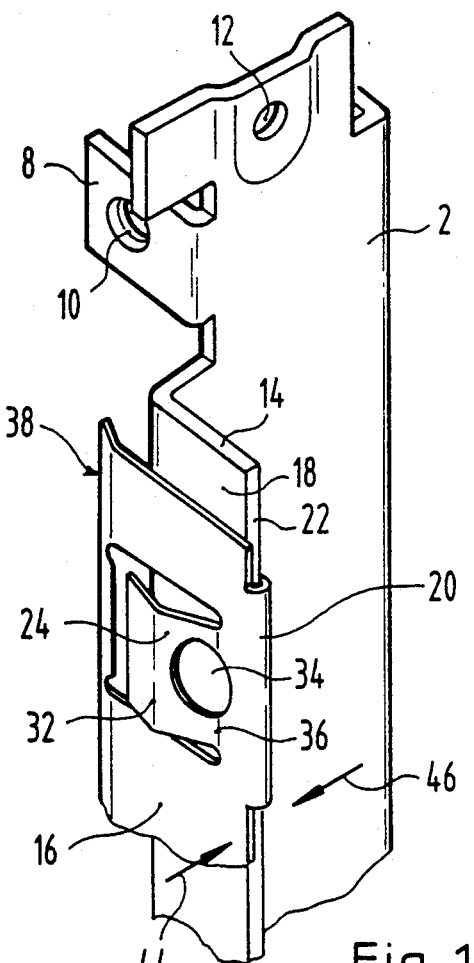
FIG. 1 shows a part of a wall unit with clamped contact strip in perspective view.
Figure 2:
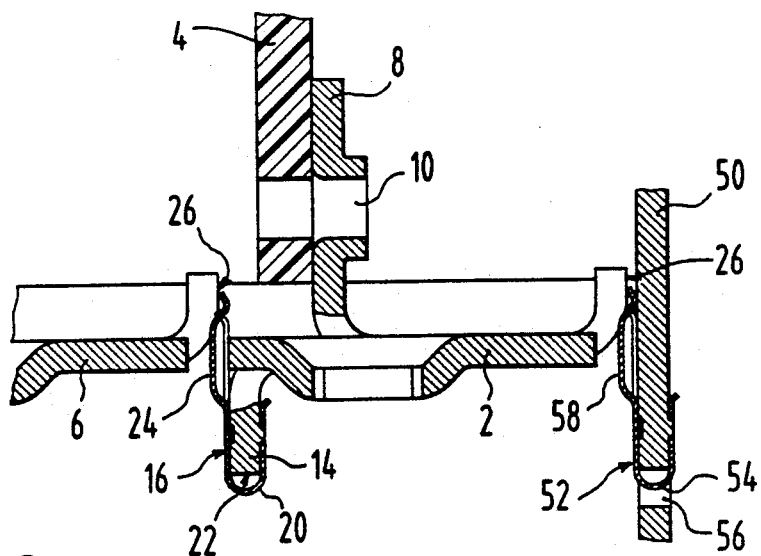
FIG. 2 shows a cross section of a wall unit between an adjoining wall unit and a wall unit assigned to wall of a device with installed contact strip.

FIG. 1 shows in a perspective view, FIG. 2 shows a cross section of a wall unit 2, which is assigned to be fastened to an edge of printed circuit board 4, as shown especially by FIG. 2. Several next to each other assigned wall units 2, 6 which can be fastened to a chassis of a device, constitute a more or less closed device wall, which closes the space for the inserted printed circuit boards to the outside. For the attachment of the printed circuit boards 4 to the wall unit 2, an attachment plate 8 with threaded hole 10 is designed in such a way that printed circuit board 4 can be fastened to attachment plate 8. A hole on the upper end of wall unit 2 serves to attach the wall unit to the chassis of a device.

A beveled edge 14 at essentially right angle to the wall unit plane is formed on wall unit 2 onto which a contact strip can be slid. The contact strip 16 touches the outside 18 of edge 14 of the adjoining wall unit 6. It has clip elements 20 which grip over the open side of edge 22 and hold the contact strip 16 on the edge rail 14. The clip elements 20 are formed in one piece with contact strip 16 and for an example are manufactured in one stamping-bending operation.

The contact strips have a series of contact tongues 24, stamped out of the contact strip wall and bent out of the contact strip wall plane.

As shown especially in FIG. 2, these contact tongues 24 are touching the contact area 26 of the adjoining wall unit.

Figure 3:
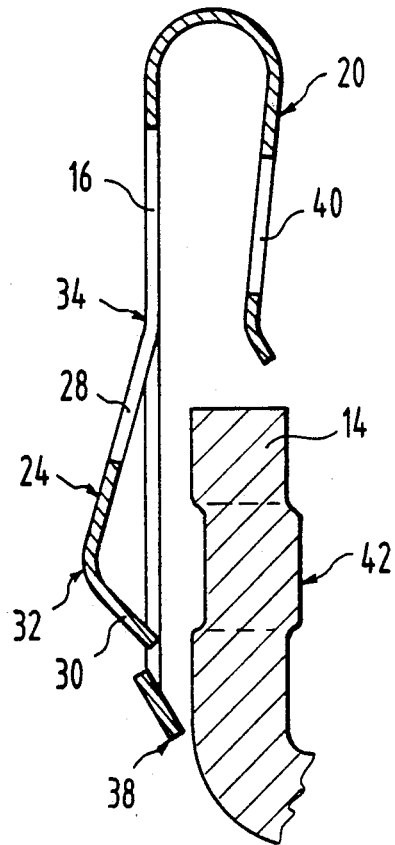
FIG. 3 is an enlarged view of a cross section of a contact strip.

As shown especially in FIG. 3, the contact tongues 24 have in the longitudinal section approximately the shape of an obtuse-angled hook with a first leg 28 bent away from the contact strip plane and a continuing leg 30, bent back into the direction of the contact strip plane. The bending edge 32 between the first leg 28 and the second leg 30 forms a line-shaped contact zone.

The contact tongues 24 are respectively equipped with a recess 34, which reduces the material cross section in the area of bending edge 36 of the first leg 28 and with that reduces the spring force of the contact tongue.

The opposite to the clip elements 20 longitudinal edge 38 of the contact strip is beveled to the side of clip element 20, e.g., to the outside 18 of edge rail 14, so that the contact strip during installation of wall unit 2 cannot interfere with the contact area 26 of the adjoining wall element 6.

The clip elements 20 are in each case equipped with recesses 40. These are meant to lock with the projections 42, when pushing the contact strip onto the edge rail 14, as can be seen especially in FIG. 3.

Figure 4:
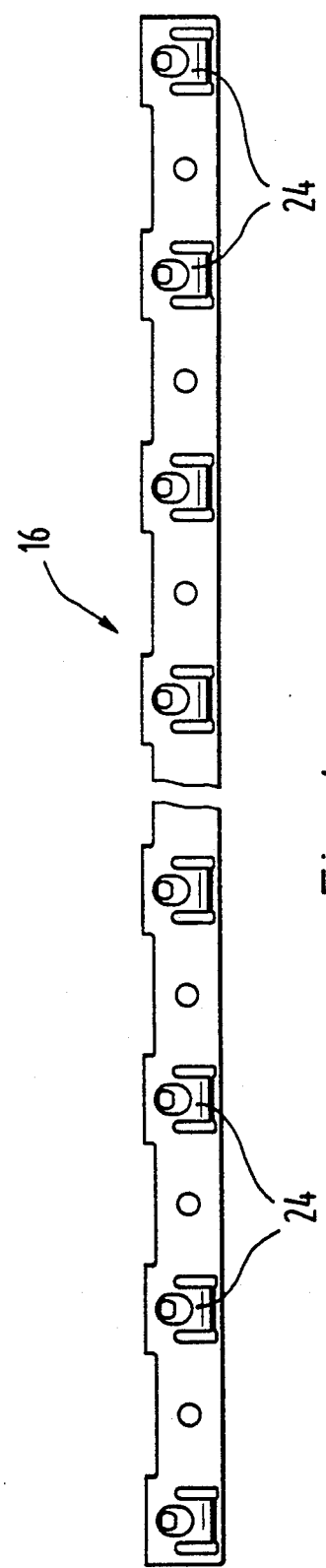
FIG. 4 is a view of a contact strip from the front.

FIG. 4 depicts a view of a contact strip in the direction of arrow 44 in FIG. 1, e.g., on the front side of contact strip 16. It can be noticed that a number of contact tongues at equal distances to each other are provided for. The space between the contact tongues is determined by the characteristics of the stray radiation. For an example, this space is between 2 and 4 cm.

Figure 5:
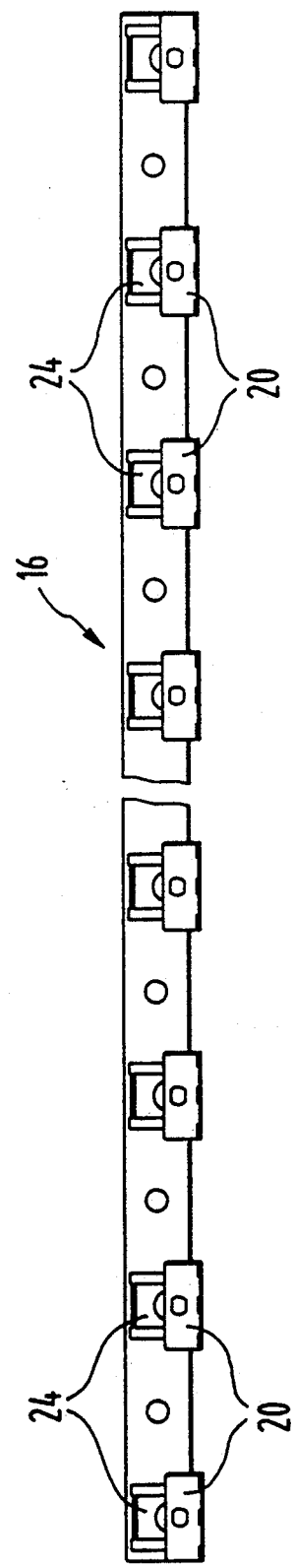
FIG. 5 is a view of a contact strip according to FIG. 4 from the rear.

FIG. 5 shows a contact strip like FIG. 4 in a view according to arrow 46 in FIG. 1, and it can be recognized that a number of clip elements 20 at equal distances to each other are provided for on the contact strip 16. As can be seen further in comparing FIG. 4 and FIG. 5, the clip elements 20 are arranged in each case in the area of contact tongues 24 and with that are arranged in the same distances to each other, so that the contact tongues and the clip elements can be fabricated at the same time with a stamping-bending tool designed for this purpose.

The contact strip 16 is manufactured from a spring-like metallic material.

As can be recognized from FIG. 2, the contact strips according to the invention are also suited for the fabricating of a shielding contact of the device wall 50 to adjoining wall unit 2. The clip elements 54 reach through suited openings 56 and overlap the boundary edge of openings 56, whereby the actual contact strip touches that side of device wall 50, which faces wall unit 2, and the contact tongues 58 of the contact strip touch the contact area 26 of wall unit 2.

Just the same according to the invention, a shielding contact can be made between a wall unit, for an example, the wall unit 6 and a device wall arranged on the left in FIG. 2. This can be understood without further explanations and for this reason is not shown in more detail.

What is claimed is:

1. A contact strip for attachment to the edge of a first wall unit and for establishing electrical contact between first and second adjacently disposed conductive wall units arranged to form a radiation shielding wall, the contact strip comprising a longitudinally extending frontal section, extending in a predetermined plane, and formed to be in engagement with one surface of a side wall of the first wall unit and a row of individual spaced-apart contact tongues bent out of the longitudinally extending frontal section and out of the predetermined plane and formed to be in contact with the second wall unit and a row of individual spaced-apart clip elements extending from one edge of the frontal section and formed to be in engagement with an opposite surface of the side wall of the first wall unit.

2. The contact strip in accordance with claim 1 wherein the clip elements each comprise a recess for locking engagement with projections on the opposite side of the side wall of the first wall unit.

3. The contact strip in accordance with claim 1 wherein the contact tongues are shaped substantially as an obtuse-angle hook having a first leg bent out of the predetermined plane and a second adjoining leg bent into the direction of the predetermined plane and having a bent edge forming a line-shaped contact zone with the second wall unit.

4. The contact strip in accordance with claim 1 wherein the frontal section comprises a longitudinal edge facing away from the clip elements and the longitudinal edge is beveled in the direction of the clip elements.

5. The contact strip in accordance with claim 1 wherein the contact tongues are bent along a bending edge and have recesses in the area of the bending edge thereby reducing the cross section of material in the area of the bending edge.

6. The contact strip in accordance with claim 1 wherein the contact tongues are spaced apart by a distance of between two centimeters and four centimeters.

7. The contact strip in accordance with claim 1 characterized in that the clip elements are spaced apart by a distance of between two centimeters and four centimeters.

8. The contact strip in accordance with claim 1 wherein each contact tongue is positioned in the same general area of the contact strip as one of the clip elements.

* * * * *